US008527831B2

(12) United States Patent
Li et al.

(10) Patent No.: US 8,527,831 B2
(45) Date of Patent: Sep. 3, 2013

(54) SYSTEMS AND METHODS FOR LOW DENSITY PARITY CHECK DATA DECODING

(75) Inventors: Zongwang Li, San Jose, CA (US); Kiran Gunnam, San Jose, CA (US); Shaohua Yang, Santa Clara, CA (US); Johnson Yen, Fremont, CA (US)

(73) Assignee: LSI Corporation, San Jose, CA (US)

( * ) Notice: Subject to any disclaimer, the term of this patent is extended or adjusted under 35 U.S.C. 154(b) by 565 days.

(21) Appl. No.: 12/767,757

(22) Filed: Apr. 26, 2010

(65) Prior Publication Data

US 2011/0264980 A1    Oct. 27, 2011

(51) Int. Cl.
*G06F 11/00* (2006.01)

(52) U.S. Cl.
USPC ............... 714/755; 714/752; 714/786

(58) Field of Classification Search
USPC .......................... 714/752, 755, 786
See application file for complete search history.

(56) References Cited

U.S. PATENT DOCUMENTS

| 5,278,846 A | 1/1994 | Okayama et al. |
| 5,317,472 A | 5/1994 | Schweitzer, III |
| 5,325,402 A | 6/1994 | Ushirokawa |
| 5,392,299 A | 2/1995 | Rhines et al. |
| 5,471,500 A | 11/1995 | Blaker et al. |
| 5,513,192 A | 4/1996 | Janku et al. |
| 5,550,870 A | 8/1996 | Blaker et al. |
| 5,612,964 A | 3/1997 | Haraszti |
| 5,701,314 A | 12/1997 | Armstrong et al. |
| 5,710,784 A | 1/1998 | Kindred et al. |
| 5,712,861 A | 1/1998 | Inoue et al. |
| 5,717,706 A | 2/1998 | Ikeda |
| 5,802,118 A | 9/1998 | Bliss et al. |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,065,149 A | 5/2000 | Yamanaka |
| 6,097,764 A | 8/2000 | McCallister et al. |
| 6,145,110 A | 11/2000 | Khayrallah |

(Continued)

FOREIGN PATENT DOCUMENTS

| EP | 0522578 | 1/1993 |
| EP | 1814108 | 8/2007 |

(Continued)

OTHER PUBLICATIONS

U.S. Appl. No. 11/461,026, filed Jul. 31, 2006, Tan, Weijun.

(Continued)

*Primary Examiner* — Bryce Bonzo
*Assistant Examiner* — Elmira Mehrmanesh
(74) *Attorney, Agent, or Firm* — Hamilton DeSanctis & Cha

(57) ABSTRACT

Various embodiments of the present invention provide systems and methods for decoding data. As an example, a data processing circuit is disclosed that includes a multi-tier decoding circuit having a first tier decoding circuit operable to decode portions of an encoded data set exhibiting low row weight, and a second tier decoding circuit operable to decode portions of an encoded data set exhibiting high row weight.

20 Claims, 7 Drawing Sheets

(56) References Cited

U.S. PATENT DOCUMENTS

| | | | |
|---|---|---|---|
| 6,216,249 B1 | 4/2001 | Bliss et al. | |
| 6,216,251 B1 | 4/2001 | McGinn | |
| 6,229,467 B1 | 5/2001 | Eklund et al. | |
| 6,266,795 B1 | 7/2001 | Wei | |
| 6,317,472 B1 | 11/2001 | Choi et al. | |
| 6,351,832 B1 | 2/2002 | Wei | |
| 6,377,610 B1 | 4/2002 | Hagenauer et al. | |
| 6,381,726 B1 | 4/2002 | Weng | |
| 6,438,717 B1 | 8/2002 | Butler et al. | |
| 6,473,878 B1 | 10/2002 | Wei | |
| 6,476,989 B1 | 11/2002 | Chainer et al. | |
| 6,625,775 B1 | 9/2003 | Kim | |
| 6,657,803 B1 | 12/2003 | Ling et al. | |
| 6,671,404 B1 | 12/2003 | Kawatani et al. | |
| 6,748,034 B2 | 6/2004 | Hattori et al. | |
| 6,757,862 B1 | 6/2004 | Marianetti | |
| 6,785,863 B2 | 8/2004 | Blankenship et al. | |
| 6,788,654 B1 | 9/2004 | Hashimoto et al. | |
| 6,810,502 B2 | 10/2004 | Eidson | |
| 6,980,382 B2 | 12/2005 | Hirano et al. | |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,073,118 B2 | 7/2006 | Greenberg et al. | |
| 7,093,179 B2 | 8/2006 | Shea | |
| 7,113,356 B1 | 9/2006 | Wu | |
| 7,173,783 B1 | 2/2007 | McEwen et al. | |
| 7,184,486 B1 | 2/2007 | Wu et al. | |
| 7,191,378 B2 | 3/2007 | Eroz et al. | |
| 7,203,015 B2 | 4/2007 | Sakai et al. | |
| 7,203,887 B2 | 4/2007 | Eroz et al. | |
| 7,236,757 B2 | 6/2007 | Raghavan et al. | |
| 7,257,764 B2 | 8/2007 | Suzuki et al. | |
| 7,310,768 B2 | 12/2007 | Eidson et al. | |
| 7,313,750 B1 | 12/2007 | Feng et al. | |
| 7,313,752 B2 * | 12/2007 | Kyung et al. | 714/801 |
| 7,370,258 B2 | 5/2008 | Iancu et al. | |
| 7,403,752 B2 | 7/2008 | Raghavan et al. | |
| 7,430,256 B2 | 9/2008 | Zhidkov | |
| 7,502,189 B2 | 3/2009 | Sawaguchi et al. | |
| 7,505,537 B1 | 3/2009 | Sutardja | |
| 7,523,375 B2 | 4/2009 | Spencer | |
| 7,587,657 B2 | 9/2009 | Haratsch | |
| 7,590,168 B2 | 9/2009 | Raghavan et al. | |
| 7,702,989 B2 | 4/2010 | Graef et al. | |
| 7,712,008 B2 | 5/2010 | Song et al. | |
| 7,752,523 B1 | 7/2010 | Chaichanavong | |
| 7,801,200 B2 | 9/2010 | Tan | |
| 7,802,163 B2 | 9/2010 | Tan | |
| 8,219,868 B1 * | 7/2012 | Chaichanavong et al. | 714/748 |
| 2003/0063405 A1 | 4/2003 | Jin et al. | |
| 2003/0081693 A1 | 5/2003 | Raghavan et al. | |
| 2003/0087634 A1 | 5/2003 | Raghavan et al. | |
| 2003/0112896 A1 | 6/2003 | Raghavan et al. | |
| 2003/0134607 A1 | 7/2003 | Raghavan et al. | |
| 2004/0071206 A1 | 4/2004 | Takatsu | |
| 2004/0098659 A1 | 5/2004 | Bjerke et al. | |
| 2005/0010855 A1 | 1/2005 | Lusky | |
| 2005/0111540 A1 | 5/2005 | Modrie et al. | |
| 2005/0157780 A1 | 7/2005 | Werner et al. | |
| 2005/0195749 A1 | 9/2005 | Elmasry et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0123285 A1 | 6/2006 | De Araujo et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0248435 A1 | 11/2006 | Haratsch | |
| 2006/0256670 A1 | 11/2006 | Park et al. | |
| 2007/0011569 A1 | 1/2007 | Casado et al. | |
| 2007/0047635 A1 | 3/2007 | Stojanovic et al. | |
| 2007/0110200 A1 | 5/2007 | Mergen et al. | |
| 2007/0168833 A1 * | 7/2007 | Lestable et al. | 714/758 |
| 2007/0192670 A1 * | 8/2007 | Ikeda et al. | 714/794 |
| 2007/0230407 A1 | 10/2007 | Petrie et al. | |
| 2007/0286270 A1 | 12/2007 | Huang et al. | |
| 2008/0049825 A1 | 2/2008 | Chen et al. | |
| 2008/0055122 A1 | 3/2008 | Tan | |
| 2008/0065970 A1 | 3/2008 | Tan | |
| 2008/0069373 A1 | 3/2008 | Jiang et al. | |
| 2008/0168330 A1 | 7/2008 | Graef et al. | |
| 2008/0276156 A1 | 11/2008 | Gunnam | |
| 2008/0301521 A1 | 12/2008 | Gunnam | |
| 2008/0301532 A1 * | 12/2008 | Uchikawa et al. | 714/773 |
| 2009/0199071 A1 | 8/2009 | Graef | |
| 2009/0235116 A1 | 9/2009 | Tan et al. | |
| 2009/0235146 A1 | 9/2009 | Tan | |
| 2009/0259915 A1 | 10/2009 | Livshitz et al. | |
| 2009/0273492 A1 | 11/2009 | Yang et al. | |
| 2009/0274247 A1 | 11/2009 | Galbraith et al. | |
| 2010/0002795 A1 | 1/2010 | Raghaven et al. | |
| 2010/0050043 A1 | 2/2010 | Valentin Savin | |
| 2010/0061492 A1 | 3/2010 | Noeldner | |
| 2010/0070837 A1 | 3/2010 | Xu et al. | |
| 2010/0164764 A1 | 7/2010 | Nayak | |
| 2010/0185914 A1 | 7/2010 | Tan et al. | |

FOREIGN PATENT DOCUMENTS

| | | |
|---|---|---|
| WO | WO 2006/016751 | 2/2006 |
| WO | WO 2006/134527 | 12/2006 |
| WO | WO 2007/091797 | 8/2007 |

OTHER PUBLICATIONS

U.S. Appl. No. 11/461,198, filed Jul. 31, 2006, Tan, Weijun.
U.S. Appl. No. 11/461,283, filed Jul. 31, 2006, Tan, Weijun.
U.S. Appl. No. 12/540,283, filed Aug. 12, 2009, Liu, et al.
U.S. Appl. No. 12/652,201, filed Jan. 5, 2010, Mathew, et al.
U.S. Appl. No. 12/763,050, filed Apr. 19, 2010, Ivkovic, et al.
U.S. Appl. No. 12/792,555, filed Jun. 2, 2010, Liu, et al.
U.S. Appl. No. 12/887,330, filed Sep. 21, 2010, Zhang, et al.
U.S. Appl. No. 12/887,369, filed Sep. 21, 2010, Liu et al.
U.S. Appl. No. 12/901,816, filed Oct. 11, 2010, Li et al.
U.S. Appl. No. 12/917,756, filed Nov. 2, 2010, Miladinovic et al.
U.S. Appl. No. 12/947,931, filed Nov. 17, 2010, Yang, Shaohua.
U.S. Appl. No. 12/947,947, filed Nov. 17, 2010, Ivkovic et al.
U.S. Appl. No. 12/972,942, filed Dec. 20, 2010, Liao et al.
Casado et al., Multiple-rate low- denstiy parity-check codes with constant blocklength, IEEE Transations on communications, Jan. 2009, vol. 57, pp. 75-83.
Collins and Hizlan, "Determinate State Convolutional Codes" IEEE Transactions on Communications, Dec. 1993.
Eleftheriou, E. et al., "Low Density Parity-Check Codes for Digital Subscriber Lines", Proc ICC 2002, pp. 1752-1757.
Fisher, R et al., "Adaptive Thresholding"[online] 2003 [retrieved on May 28, 2010] Retrieved from the Internet <URL:http://homepages.inf.ed.ac.uk/rbf/HIPR2/adpthrsh.htm.
Fossnorier, Marc P.C. "Quasi-Cyclic Low-Density Parity-Check Codes From Circulant Permutation Maricies" IEEE Transactions on Information Theory, vol. 50, No. 8 Aug. 8, 2004.
Gunnam, K et al. "Tech. Note on Iterative LDPC Solutions for Turbo Equal.", K. Gunnam, G. Choi and M. Yeary, TX A&M Tech. Note, Rpt. Dt: Jul. 2006 Avail. online dropzone.tamu.edu.
K. Gunnam et al., "Next Generation iterative LDPC solutions for magnetic recording storage, "invited paper. The Asilomar Conference on Signals, Systems, and Computers, Nov. 2008.
Han and Ryan, "Pinning Techniques for Low-Floor Detection/Decoding of LDPC-Coded Partial Response Channels", 5th International Symposium on Turbo Codes &Related Topics, 2008.
Lee et al., "Partial Zero-Forcing Adaptive MMSE Receiver for DS-CDMA Uplink in Multicell Environments" IEEE Transactions on Vehicular Tech. vol. 51, No. 5, Sep. 2002.
Mohsenin et al., "Split Row: A Reduced Complexity, High Throughput LDPC Decoder Architecture", pp. 1-6, printed from www.ece.ucdavis.edu on Jul. 9, 2007.
Sari H et al., "Transmission Techniques for Digital Terrestrial TV Broadcasting" IEEE Communications Magazine, IEEE Service Center Ny, NY vol. 33, No. 2 Feb. 1995.

Unk, "Auto threshold and Auto Local Threshold" [online] [retr. May 28, 2010] Retr. from the Internet www.dentristy.bham.ac.uk/landinig/software/autothreshold/autothreshold.html.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Wang Y et al., "A Soft Decision Decoding Scheme for Wireless COFDM With App. to DVB-T" IEEE Transactions on Consumer elect., IEEE Service Center, NY,NY vo. 50, No. 1 Feb. 2004.

Weon-Cheol L. et al., "Vitierbi Decoding Method Using Channel State Information in COFDM System" IEEE Trans. on Consumer Elect., IEEE Service Center, NY, NY vol. 45 No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Youn, "BER Perf. Due to Irreg. of Row-Weoght Distr. of the Parity-Check Matirx in Irregular LDPC Codes for 10-Gb/s Optical Signals" Journal of Lightwave Tech., vol. 23 Sep. 9, 2005.

Zhong et al., "Area-Efficient Min-Sum Decoder VLSI Architecture for High-Rate QC-LDPC Codes in Magnetic Recording", pp. 1-15, Submitted 2006, not yet published.

Zhong, "Block-LDPC: A Practical LDPC Coding System Design Approach", IEEE Trans. On Circuits, Regular Papers, vol. 5, No. 4, pp. 766-775, Apr. 2005.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

K. Gunnam et al., "Value-Reuse Properties of Min-Sum for GF(q)" (dated Oct. 2006) Dept. of ECE, Texas A&M University Technical Note, published about Aug. 2010.

K. Gunnam et al., "Value-Reuse Properties of Min-Sum for GF(q)"(dated Jul. 2008) Dept. of ECE, Texas A&M University Technical Note, published about Aug. 2010.

K. Gunnam "Area and Energy Efficient VLSI Architectures for Low-Density Parity-Check Decoders Using an On-The-Fly Computation" dissertation at Texas A&M University, Dec. 2006.

* cited by examiner

2

SYSTEMS AND METHODS FOR LOW DENSITY PARITY CHECK DATA DECODING

BACKGROUND OF THE INVENTION

The present inventions are related to data processing, and more particularly to systems and methods for decoding data.

Data storage and transmission systems typically encode a data set prior to either storage or transmission. Later, the encoded data set is decoded and the originally provided data set is utilized. Robust encoding and decoding facilitates enhanced data recovery and in some cases error correction. As a general rule, an increase in the robustness of an encoding and decoding approach results in an increase in circuit complexity. Such circuit complexity may not be practical, and yet enhanced data recovery may be desired.

Hence, for at least the aforementioned reasons, there exists a need in the art for advanced systems and methods for encoding data.

BRIEF SUMMARY OF THE INVENTION

The present inventions are related to data processing, and more particularly to systems and methods for decoding data.

Various embodiments of the present invention provide data processing circuits that include a multi-tier decoding circuit having a first tier decoding circuit operable to decode portions of an encoded data set exhibiting low row weight, and a second tier decoding circuit operable to decode portions of an encoded data set exhibiting high row weight. In some instances, the multi-tier decoding circuit includes a row weight determination circuit operable to receive a portion of the encoded data set and to provide an indication of whether the received portion exhibits a high weight or a low weight. In some such instances, the encoded data set includes a high weight row portion and a low weight row portion. The row weight determination circuit includes a counter that counts received bits and utilizes the count value to indicate whether the received bits are associated with the high weight row portion or the low weight row portion.

In other instances, the first tier decoding circuit applies a minimum processing algorithm to yield a first output, the second tier decoding provides default values as a second output, and one of the first output or the second output is provided as low density parity check minimum values for the multi-tier decoding circuit. In some such instances, the multi-tier decoding circuit includes a selector circuit that selects between the first output and the second output to be provided as the low density parity check minimum values for the multi-tier decoding circuit. The first output is selected when the encoded data set exhibiting low row weight, and the second output is selected when the encoded data set exhibits high row weight. In various instances, the multi-tier decoding circuit includes a comparator circuit operable to compare a number of violated checks for the currently processing portion of the encoded data set with a first predefined threshold value and a second predefined threshold. In some such instances, the default values may be a first set of default values, a second set of default values or a third set of default values. The second output includes the first set of default values when the number of violated checks for the currently processing portion of the encoded data set is less than a first predefined threshold level. The second output includes the second set of default values when the number of violated checks for the currently processing portion of the encoded data set is greater than or equal to the first predefined threshold level and less than a second predefined threshold value. The second output includes the third set of default values when the number of violated checks for the currently processing portion of the encoded data set is greater than or equal to the second predefined threshold value.

In yet other instances, the first tier decoding circuit applies a minimum processing algorithm to yield a first output, and the second tier decoding circuit applies the minimum processing algorithm to a modified version of the encoded data set to yield a second output. In some such instances, the multi-tier decoding circuit includes a masking circuit operable to mask '1s' in the encoded data set to yield an encoded data set exhibiting only rows of low weight that are provided as the modified version of the encoded data set. In such cases, the multi-tier decoding circuit can include a sign calculation circuit operable to calculate a sign of the currently processing portion of the encoded data set unmodified by the masking circuit. The second output is a combination of the sign with the result of the minimum processing of the modified version of the encoded data set.

Other embodiments of the present invention provide methods for low density parity check decoding. The methods include: receiving an encoded data set having a first portion with rows exhibiting low weight and a second portion with rows exhibiting high weight; determining whether a sub-set of the encoded data set is included in the first portion or the second portion; and determining a pair of low density parity check minimum values for the sub-set of the encoded data set based at least in part on whether the sub-set is included in the first portion or the second portion. In some cases, determining the pair of low density parity check minimum values for the sub-set of the encoded data set includes: applying a minimum processing algorithm to the sub-set of the encoded data set to yield a first output where the sub-set of the encoded data set is included in the first portion; and applying the minimum processing algorithm to a modified version of the encoded data set to yield a second output where the sub-set of the encoded data set is included in the second portion. The modified version of the encoded data set is modified to eliminate at least one '1' from the encoded data set such that the modified version of the encoded data set exhibits only rows of low weight. The methods can further include calculating a sign of the sub-set of the encoded data set; and combining the sign with the second output to yield the pair of low density parity check minimum values when the sub-set of the encoded data set is included in the second portion.

In other cases, determining the pair of low density parity check minimum values for the sub-set of the encoded data set includes: applying a minimum processing algorithm to the sub-set of the encoded data set to yield a minimums output; selecting a pair of default values where the sub-set of the encoded data set is included in the first portion; providing the minimums output as the pair of low density parity check minimum values for the multi-tier decoding circuit when the sub-set of the encoded data set is included in the first portion; and providing the pair of default values as the pair of low density parity check minimum values for the multi-tier decoding circuit when the sub-set of the encoded data set is included in the second portion.

Yet other embodiments of the present invention provide data manipulation systems including: a data receiving circuit having a multi-tier decoding circuit having a first tier decoding circuit operable to decode portions of an encoded data set exhibiting low row weight, and a second tier decoding circuit operable to decode portions of an encoded data set exhibiting high row weight; and a data transfer circuit having a multi-stage encoder circuit operable to generate the encoded data set from an original data set. The data manipulation system may be, for example, a storage device or a data transmission device.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to data processing, and more particularly to systems and methods for decoding data.

Various embodiments of the present invention provide multi-tier decoder circuits capable of efficient operation on hybrid encoded data where portions of the encoded data exhibit low weight for a given row, and other portions of the encoded data exhibit high weight for a given row. As used herein, the phrase "low weight" is used in its broadest sense to mean a row with one bit that is set at a value different than the other bits. For example, a low weight row may have one single '1' and more than one '0'. As used herein, the phrase "high weight" is used in its broadest sense to mean a row that is not low weight.

Figure 1A:
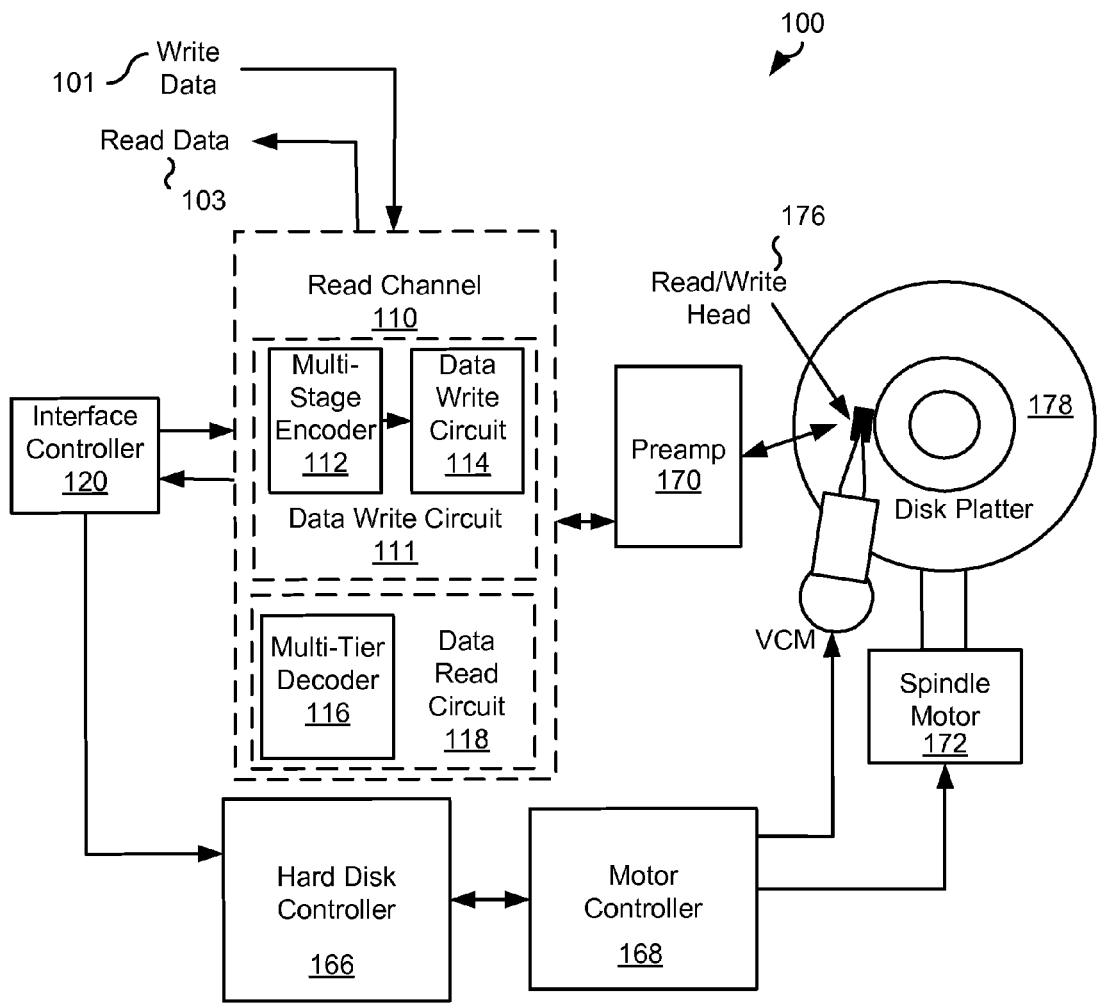
FIG. 1a depicts a storage device including a read channel with a multi-tier decoder circuit in accordance with various embodiments of the present invention.

Turning to FIG. 1a, a storage system 100 is shown including a read channel 110 including a data write circuit 111 and a data read circuit 118. Storage system 100 may be, for example, a hard disk drive. Based upon the disclosure provided herein, one of ordinary skill in the art will recognize a variety of storage systems that may include the circuitry discussed in relation to FIG. 1a. Data write circuit 111 includes a multi-stage encoder circuit 112 and a data write circuit 114. Multi-stage encoder circuit 112 may be implemented similar to those described in U.S. patent application Ser. No. 12/767,761 entitled "Systems and Methods for Low Density Parity Check Data Encoding" and filed by Li et al. on a day even herewith. The aforementioned reference is incorporated herein by reference for all purposes. Data read circuit 118 includes a multi-tier decoder 116. Data read circuit 118 may be implemented similar to that discussed in relation to FIG. 3 below. Multi-tier decoder 116 may be implemented similar to that discussed below in relation to FIG. 4, and/or may operate in accordance with one of the flow diagrams of FIG. 5 and FIG. 6. Data read circuit 118 receives data retrieved from a disk platter 178 and performs a data decode process using a decoder 156. The data decode process substantially reverses the encoding originally applied by multi-stage encoder circuit 112.

In addition, storage system 100 includes a preamplifier 170 that amplifies a minute electrical signal received from a read/write head assembly 176. Read/write head assembly 176 is disposed in relation to disk platter 178. Storage system 100 also includes an interface controller 120, a hard disk controller 166, a motor controller 168, and a spindle motor 172. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with a perpendicular recording scheme. In other embodiments of the present invention, disk platter 178 includes magnetic signals recorded in accordance with a longitudinal recording scheme.

In a read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to data read circuit 118 of read channel 110 via preamplifier 170. Preamplifier 170 is operable to amplify the minute analog signals accessed from disk platter 178. In turn, data read circuit 118 decodes the received information using decoder 116 as part of a process of digitizing the received analog signal to recreate the information originally written to disk platter 178. This data is provided as read data 103 to a receiving circuit.

A write operation is substantially the opposite of the preceding read operation. In particular, write data 101 is received by data write circuit 111 of read channel 110. Write data 101 is encoded by encoder circuit 112, and the encoded data is provided to a data write circuit 114. Data write circuit 114 drives the encoded data to preamplifier 170. The data amplified by preamplifier 170 are provided to read/write head assembly 176 that generates a corresponding magnetic field that is recorded on disk platter 178 at locations controlled by motor controller 168.

Figure 1B:
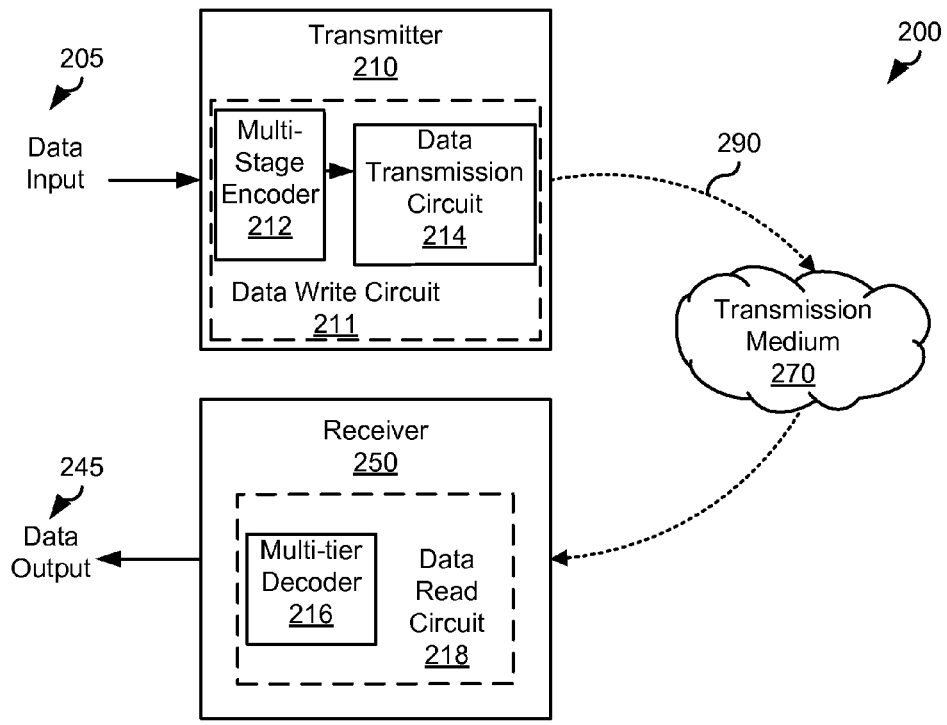
FIG. 1b depicts a data transmission system including a multi-tier decoder circuit in accordance with one or more embodiments of the present invention.

Turning to FIG. 1b, a transmission system 200 is shown including a read channel 110 including a transmitter 210 and a receiver 250. Transmission system 200 may be, for example, two cellular telephones or radio sets. Based upon the disclosure provided herein, one of ordinary skill in the art will recognize a variety of transmission systems that may include the circuitry discussed in relation to FIG. 1b. Transmitter 210 includes a multi-stage encoder circuit 212 and a data write circuit 214. Multi-stage encoder circuit 212 may be implemented similar to those described in the previously incorporated reference entitled "Systems and Methods for Low Density Parity Check Data Encoding". Data read circuit 218 includes a multi-tier decoder 216. Data read circuit 218 may be implemented similar to that discussed in relation to FIG. 3 below. Multi-tier decoder 216 may be implemented similar to that discussed below in relation to FIG. 4, and/or may operate in accordance with one of the flow diagrams of FIG. 5 and FIG. 6. Receiver 250 receives data received from transmitter 210 via a transmission system 270. Receiver 250 includes a data read circuit 258 having a decoder 256. Decoder 256 implements a decode process that substantially reverses the encoding originally applied by multi-stage encoder circuit 212.

Turning to FIG. 1b, a transmission system 200 is shown including a transmitter 210 and a receiver 250. Transmission system 200 may be, for example, two cellular telephones or radio sets. Based upon the disclosure provided herein, one of ordinary skill in the art will recognize a variety of transmission systems that may include the circuitry discussed in relation to FIG. 1b. Transmitter 210 includes a multi-stage encoder circuit 212 and a data write circuit 214. Multi-stage encoder circuit 212 may be implemented similar to those described in the previously incorporated reference entitled "Systems and Methods for Low Density Parity Check Data Encoding". Data read circuit 218 includes a multi-tier decoder 216. Data read circuit 218 may be implemented similar to that discussed in relation to FIG. 3 below. Multi-tier decoder 216 may be implemented similar to that discussed below in relation to FIG. 4, and/or may operate in accordance with one of the flow diagrams of FIG. 5 and FIG. 6. Receiver 250 receives data received from transmitter 210 via a transmission system 270. Receiver 250 includes a data read circuit 218 having multi-tier decoder 216. Multi-tier decoder 216 implements a decode process that substantially reverses the encoding originally applied by multi-stage encoder circuit 212.

In operation, a data input 205 is provided to transmitter 210. Multi-stage encoder circuit 212 encodes the received data input and provides an encoded output to a data transmission circuit 214. Data transmission circuit 214 converts the data into a radio frequency signal 290 that is transmitted via transmission system 270. Receiver 250 receives the radio frequency signal that is processed by data read circuit 258. Such processing includes data decoding by multi-tier a decoder 216. Ultimately, the decoded data is provided as a data output 245 which corresponds to data input 205.

Figure 2:
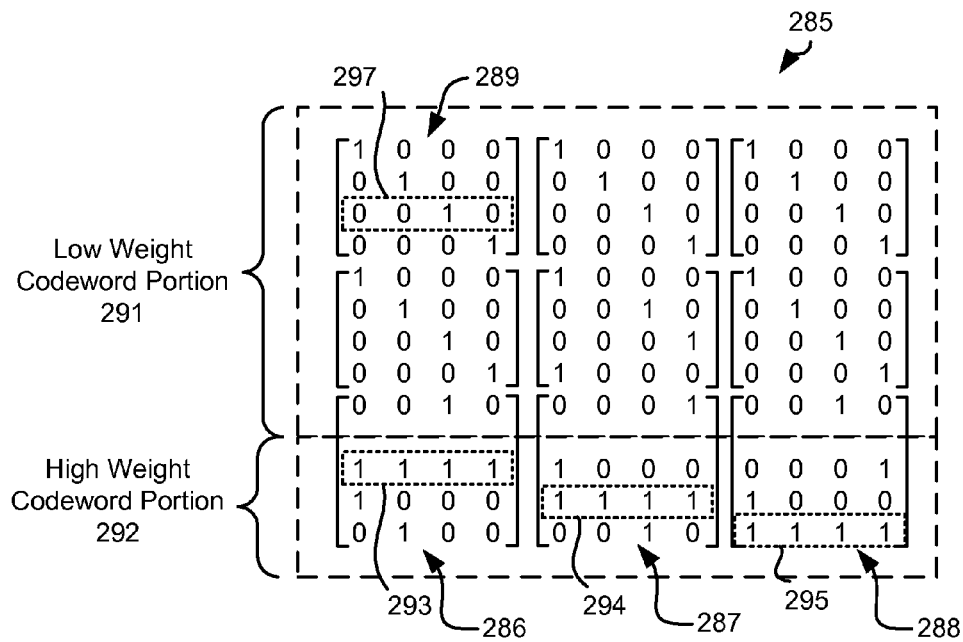
FIG. 2 depicts an exemplary encoded data set exhibiting both low weight rows and high weight rows that may be decoded using multi-tier decoder circuits in accordance with various embodiments of the present invention.

Turning to FIG. 2, an exemplary encoded data set 285 is depicted. Encoded data set 285 includes a low weight codeword portion 291 and a high weight codeword portion 292. Low weight codeword portion 291 includes rows of low weight. As one example, a low weight row portion 297 is outlined by dashed lines and is included as part of a circulant 289 (i.e., the 4×4 arrangement of bits include in the square brackets). High weight codeword portion 292 includes some rows of high weight. As one example, a high weight row portion 293 is outlined by dashed lines and is included as part of a circulant 286 (i.e., the 4×4 arrangement of bits include in the square brackets). As another example, a high weight row portion 294 is outlined by dashed lines and is included as part of a circulant 287 (i.e., the 4×4 arrangement of bits include in the square brackets). As yet another example, a high weight row portion 295 is outlined by dashed lines and is included as part of a circulant 288 (i.e., the 4×4 arrangement of bits include in the square brackets). It should be noted that encoded data set 285 is merely exemplary, and that one of ordinary skill in the art will recognize a myriad of encoded data sets that may be processed using multi-tier decoder circuits in accordance with various embodiments of the present invention.

Figure 3:
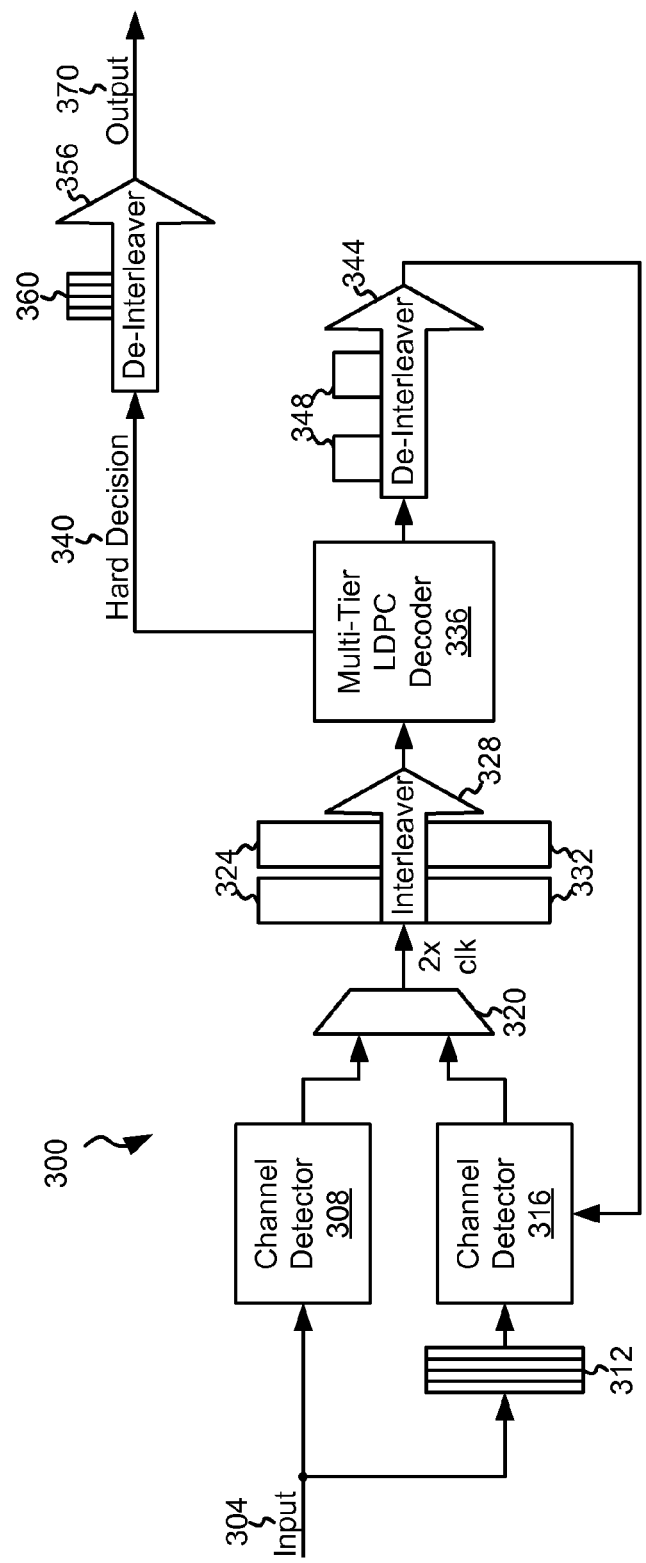
FIG. 3 depicts a data processing system including a multi-tier decoder circuit in accordance with various embodiments of the present invention.

Turning to FIG. 3, data processing circuit 300 including a multi-tier decoder circuit is depicted in accordance with some embodiments of the present invention. Data processing circuit 300 includes various elements disclosed in U.S. patent application Ser. No. 12/114,462 entitled "Systems and Methods for Queue Based Data Detection and Decoding", and filed May 2, 2008 by Yang et al. The entirety of the aforementioned reference is incorporated herein by reference for all purposes. Data processing circuit 300 includes a data input 304 that is fed to a channel detector 308. Channel detector 308 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 304 is provided to a input data buffer 312 that is designed to hold a number of data sets received from data input 304. The size of input data buffer 312 may be selected to provide sufficient buffering such that a data set input via data input 304 remains available at least until a first iteration processing of that same data set is complete and the processed data is available in a ping pong buffer 348 (i.e., a queuing buffer) as more fully described below. Input data buffer 312 provides the data sets to a channel detector 316. Similar to channel detector 308, channel detector 316 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 308 and channel detector 316 are provided to an interleaver circuit 328 via a multiplexer 320. Such outputs may be, for example, log likelihood ratio values. Interleaver circuit 320 interleaves the output of channel detector 308 and separately interleaves the output of channel detector 316 using two ping pong buffers 324, 332. One of the buffers in ping pong buffer 324 holds the result of a prior interleaving process of the output from channel detector 308 and is unloaded to a multi-tier LDPC decoder 336, while the other buffer of ping pong buffer 324 holds a data set from channel detector 308 that is currently being interleaved. Similarly, one of the buffers in ping pong buffer 332 holds the result of a prior interleaving process of the output from channel detector 316 and is unloaded to multi-tier LDPC decoder 336, while the other buffer of ping pong buffer 324 holds a data set from channel detector 316 that is currently being interleaved. Multi-tier LDPC decoder 336 may be implemented similar to that discussed below in relation to FIG. 4, and/or may operate in accordance with one of the flow diagrams of FIG. 5 and FIG. 6.

Multi-tier LDPC decoder 336 is capable of decoding one or more data sets simultaneously. As an example, multi-tier LDPC decoder 336 may be designed to decode an interleaved data set from ping pong buffer 324, or an interleaved data set from ping pong buffer 332, or to decode interleaved data sets from ping pong buffer 324 and ping pong buffer 332 simultaneously. The decoded data is either provided as a hard decision output 340 and/or to a de-interleaver circuit 344 that uses ping pong buffer 348 to de-interleave the decoded data and to provide the de-interleaved data as an input to channel detector 316. One of the buffers in ping pong buffer 348 holds the result of a prior de-interleaving process and is unloaded to channel detector 316, while the other buffer of ping pong buffer 348 holds a decoded data set currently being de-interleaved. Hard decision output 340 is provided to a de-interleaver circuit 356 that de-interleaves hard decision output 340 and stores the de-interleaved result in an output data buffer 360. Ultimately, de-interleaver circuit 356 provides the de-interleaved data stored in output data buffer 360 as an output 370.

In operation, a first data set is introduced via data input 304 to channel detector 308. Channel detector 308 performs its channel detection algorithm and provides both a hard output and a soft output to multiplexer 320. The hard and soft decision data is written to one buffer of ping pong buffer 324. At the same time the detector output is written into the buffer, interleaver 328 interleaves the data set by writing consecutive data into non-consecutive memory/buffer addresses based on the interleaver algorithm/mapping. Once interleaver 324 completes its interleaving process, the interleaved data is decoded by multi-tier LDPC decoder 336. Where the data converges, multi-tier LDPC decoder 336 writes its output as hard decision output 340 to output data buffer 360 and the processing is completed for that particular data set. Alternatively, where the data does not converge, multi-tier LDPC decoder 336 writes its output (both soft and hard) to ping pong buffer 348. As more fully described below, the scheduling guarantees that there is at least one empty buffer for holding this new set of data, and this strategy assures that each data input is guaranteed the possibility of at least two global iterations (i.e., two passes through a detector and decoder pair).

The data written to ping pong buffer 348 is fed back to channel detector 316. Channel detector 316 selects the data set that corresponds to the output in ping pong buffer 348 from input data buffer 312 and performs a subsequent data detection aided by the soft output data generated by multi-tier LDPC decoder 336 fed back from ping pong buffer 348. By using the previously generated soft data for data maintained in input data buffer 312, channel detector 316 generally performs a subsequent channel detection with heightened accuracy. The output of this subsequent channel detection is passed to interleaver 328 via multiplexer 320. The data is written to one buffer of ping pong buffer 332, and interleaver 328 interleaves the data. The interleaved data is then passed to multi-tier LDPC decoder 336 where it is decoded a second time. Similar to the first iteration, a decision is made as to whether the data converged or whether there is insufficient space in ping pong buffer 348 to handle the data. Where such is the case, multi-tier LDPC decoder 336 writes its output as hard decision output 340 to output data buffer 360 and the processing is complete for that particular data set. Alternatively, where the data does not converge and there is sufficient buffer space in ping pong buffer 348 to receive an additional data set, writes its output (both soft and hard) to ping pong buffer 348 where it is passed back to channel detector 316 for a third pass. Sufficient space is defined in ping pong buffer 348 by having at least reserved space for the data set from the first detector and decoder after the data set from the second detector and decoder is written into the ping pong buffer.

It should be noted that, as an example, a first data set may be applied at data input 304 and that it takes a number of iterations to converge while all subsequent data sets applied at data input 304 converge on the first pass (i.e., on a single iteration). In such a case, the first data set may be processed a number of times (i.e., a number of iterations) that is limited by the amount of memory available in output data buffer 360. Once output data buffer 360 is full or once an ordered set of outputs are available, the most recent hard decision output corresponding to the first data set is provided as a hard decision output and de-interleaver 356 re-orders the outputs putting the first output in the first position. With this done, output data buffer 360 are flushed out as output 370. In some embodiments of the present invention, de-interleaver 356 does not perform a re-ordering function and output data buffer 360 has a very limited size. In such a case, it is conceivable that a data set could be processed a very large number times (i.e., a large number of iterations) only limited by how long a recipient of output 370 is willing to wait for the data. As another example, it is possible that all data applied as data input 304 converges on its first pass. In such a case, channel detector 316, multi-tier LDPC decoder 336 and/or de-interleaver 344 may be placed in a power saving mode to conserve power. As yet another example, it may be the case that all data sets applied at data input 304 fail to converge on the first pass (i.e., a single iteration). In such a case, all data sets would be iterated twice. It should also be noted that one or more additional channel detectors may be added along with additional space in ping pong buffers 324, 332, 248 that would facilitate more iterations in the situation where a significant number of closely located data sets fail to converge. In such cases, all data sets can be guaranteed to be decoded with number of iterations the same as the number of detectors.

Based on the disclosure provided herein, it will be appreciated that data processing circuit 300 allows for performance of a variable number of detection and decoding iterations depending upon the introduced data. Further, in some cases, considerable power savings may be achieved through use of data processing circuit 300. Yet further, in some cases, a faster LDPC decoder may be implemented allowing for an increased throughput where substantial first iteration data convergence exists as multiple iterations are not necessarily required. Yet further, by allowing results of multi-tier LDPC decoder 336 to be reported out of order, upstream processing does not have to wait for the completion of downstream processing. Re-ordering of the out of order results may be done by data processing circuit 300 or by a downstream recipient of output 370.

Figure 4A:
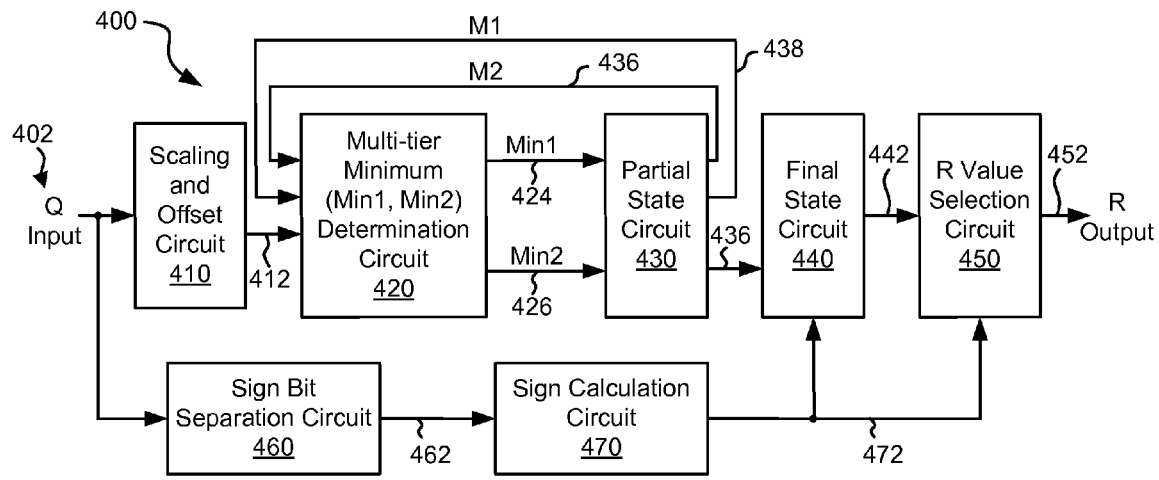
FIG. 4a is a block diagram of a multi-tier decoder circuit in accordance with one or more embodiments of the present invention.

Turning to FIG. 4a, a block diagram of a multi-tier decoder circuit 400 is shown in accordance with one or more embodiments of the present invention. Multi-tier decoder circuit 400 includes a scaling and offset circuit 410 that receives a Q input 402 from a source. The source of Q input 402 may be, but is not limited to, an upstream cyclic shifter circuit as are known to be used in decoder circuits. Based upon the disclosure provided herein, one of ordinary skill in the art will recognize a variety of sources of Q input 402. Scaling and offset circuit 410 performs and scaling and/or offset adjustments to Q input 402 and provides a modified output 412 to a multi-tier minimum determination circuit 420. Based upon the disclosure provided herein, one of ordinary skill in the art will recognize a variety of scaling and/or offsets that may be applied to the received Q input 402 to yield modified output 412 that is satisfactory for use by the decoder circuit.

Multi-tier minimum determination circuit 420 determines interim decoding values (i.e., Min1 and Min2) values as part of a low density parity check (LDPC) algorithm, and provides the values as a Min1 output 424 and Min2 output 426 to a partial state circuit 430. Min1 output 424 and Min2 426 are in part calculated based upon interim feedback (i.e., M1 438 and M2 436) from partial state circuit 430. Operation of multi-tier minimum determination circuit 420 depends upon whether modified output 412 exhibits a row of low weight or high weight. Where modified output 412 exhibits a row of low weight, a standard minimum processing is applied. Such standard minimum processing may be done using any minimum processing approach or circuitry known in the art. As an example, U.S. patent application Ser. No. 12/492,374 entitled "Reconfigurable Cyclic Shifter" and filed by Gunnam on Jun. 26, 2009 discloses one approach to minimum processing that may be used in relation to embodiments of the present invention. The aforementioned reference is incorporated herein by reference for all purposes. Based upon the disclosure provided herein, one of ordinary skill in the art will recognize a variety of standard minimum processing approaches and circuits that may be used in relation to different embodiments of the present invention. Alternatively, where modified output 412 exhibits a row of high weight, another tier of processing may be applied.

In one embodiment of the present invention, multi-tier minimum determination circuit 420 performs a tiered determination of Min1 output 424 and Min2 output 426 depending upon whether modified output 412 exhibits a row of low weight, and the number of violated checks (hereinafter "NVC") detected by the decoder relative to two distinct threshold levels (hereinafter "T1" and "T2"). The following pseudocode describes and example of such operation:

```
If (Modified Output 412 Exhibits a Row of Low Weight)
{
    Perform Standard Minimum Processing to Yield
    Min1_Standard and Min2_Standard;
    Min1 Output 424 = Min1_Standard;
    Min2 Output 426 = Min2_Standard
}
Else If (NVC < T1)
{
    Min1 Output 424 = a1;
    Min2 Output 426 = b1
}
Else If (NVC >= T1 and NVC< T2)
{
    Min1 Output 424 = a2;
    Min2 Output 426 = b2
}
Else
{
    Min1 Output 424 = a3;
    Min2 Output 426 = b3
}
```

In this case, a1, b1, a2, b2, a3 and b3 are predefined constants. Determining whether modified output 412 exhibits low weight or high weight may be done by determining which row of the codeword is being processed. Thus, for example, where modified output 412 corresponds to encoded data set 285, a row of low weight is determined by whether it is included in the rows of low weight codeword portion 291. Similarly, a row of high weight is determined by whether it is included in high weight codeword portion 292. One exemplary circuit capable of implementing the aforementioned pseudocode is described in relation to FIG. 4b below.

In another embodiment of the present invention, multi-tier minimum determination circuit 420 performs a tiered determination of Min1 output 424 and Min2 output 426 depending upon whether modified output 412 exhibits a row of low weight. The following pseudocode describes and example of such operation:

```
If (Modified Output 412 Exhibits a Row of Low Weight)
{
    Perform Standard Minimum Processing to Yield
    Min1_Standard and Min2_Standard;
    Min1 Output 424 = Min1_Standard;
    Min2 Output 426 = Min2_Standard
}
Else
{
    Perform Standard Minimum Processing on circulant portion of row of
        high weight to Yield Min1_Standard and Min2_Standard;
    Min1 Output 424 = Min1_Standard for all nodes related to the
        current row check equation;
    Min2 Output 426 = Min2_Standard for all nodes related to the
        current row check equation;
    Set the sign of each node equal to the sign calculated for the
        actual node
}
```

Determining whether modified output 412 exhibits low weight or high weight may be done by determining which row of the codeword is being processed. Thus, for example, where modified output 412 corresponds to encoded data set 285, a row of low weight is determined by whether it is included in the rows of low weight codeword portion 291. Similarly, a row of high weight is determined by whether it is included in high weight codeword portion 292. One exemplary circuit capable of implementing the aforementioned pseudocode is described in relation to FIG. 4c below.

Partial state circuit 430 receives Min1 output 424 and Min2 output and determines corresponding magnitude values M1 436 and M2 438 from a register memory. M1 438 and M2 436 are provided as feedback to multi-tier minimum determination circuit 420. In addition, partial state circuit 430 provides a final state selection output 436 to a final state circuit 440. Partial state circuit 430 may be implemented similar to the partial state processors disclosed in U.S. patent application Ser. No. 12/475,786 entitled "Error-Correction Decoder Employing Check-Node Message Averaging" and filed by Gunnam et al. on Jun. 1, 2009. The aforementioned reference is incorporated herein by reference for all purposes. Based upon the disclosure provided herein, one of ordinary skill in the art will recognize a variety of partial processing circuits that may be used in relation to different embodiments of the present invention.

Final state circuit 440 includes a memory from which a final state value 442 is obtained. Final state value 442 is the value in the memory at a location addressed by a combination of a sign output 472 and final state selection output 436 from partial state circuit 430. Final state circuit 440 may be implemented similar to the final state circuit and offset circuit disclosed in U.S. patent application Ser. No. 12/475,786 entitled "Error-Correction Decoder Employing Check-Node Message Averaging" that was previously incorporated herein by reference for all purposes. Based upon the disclosure provided herein, one of ordinary skill in the art will recognize a variety of final state circuits that may be used in relation to different embodiments of the present invention.

A sign bit separation circuit 460 is responsible for separating sign information from Q input 402. In one particular embodiment of the present invention, sign bit separation circuit 460 is a two's-complement-to-sign-magnitude conversion circuit as are known in the art. Sign bit separation circuit 460 performs the sign bit conversion on Q input 402 and provides a corresponding sign output value 462. Sign output value 462 is provided to a sign calculation circuit 470. Sign calculation circuit 470 generates a product of the sign bits received as sign output values for a given number of messages provided as part of a received encoded data set. Sign calculation circuit 470 provides sign output 472 that is provided to both final state circuit 440 and an R value selection circuit 450. Sign value calculation circuit 470 may be implemented using the sing processing logic disclosed in U.S. patent application Ser. No. 12/492,374 entitled "Reconfigurable Cyclic Shifter" that was previously incorporated herein by reference for all purposes. Based upon the disclosure provided herein, one of ordinary skill in the art will recognize a variety of sign calculation circuits that may be used in relation to different embodiments of the present invention.

Final state value 442 and sign value 472 are provided to an R value selection circuit 450. R value selection circuit 450 selected one of the values provided as part of final state value 442 to output as an R output 452. In one embodiment, R value selection circuit 450 is implemented as a multiplexer receiving the distinct values of final state value 442 as different multiplexer inputs. The multiplexer selection is based in part on sign value 472. R value selection circuit 450 may be implemented similar to the R selectors disclosed in U.S. patent application Ser. No. 12/475,786 entitled "Error-Correction Decoder Employing Check-Node Message Averaging" that was previously incorporated herein by reference for all purposes. Based upon the disclosure provided herein, one of ordinary skill in the art will recognize a variety of R value selection circuits that may be used in relation to different embodiments of the present invention.

Figure 4B:
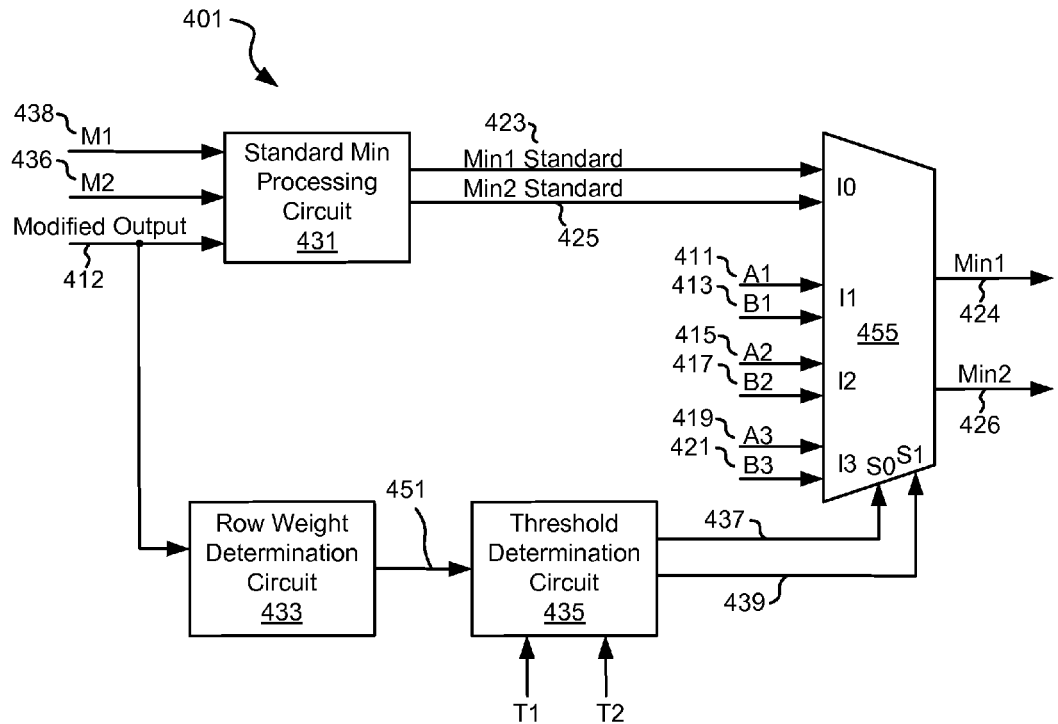
FIG. 4b shows a minimum determination circuit that may be used in relation to the multi-tier decoder circuit of FIG. 4a in accordance with particular embodiments of the present invention.

Turning to FIG. 4b, a minimum determination circuit 401 that may be used in relation to multi-tier decoder circuit 400 is shown in accordance with particular embodiments of the present invention. Minimum determination circuit 401 includes a standard minimum processing circuit 431 that receives modified output 412, M1 438 and M2 436. Using these inputs, standard minimum processing circuit 431 identifies minimums similar to that done in relation to standard LDPC processing. One example of such processing is disclosed in U.S. patent application Ser. No. 12/492,374 entitled "Reconfigurable Cyclic Shifter" that was previously incorporated herein by reference for all purposes. Based upon the disclosure provided herein, one of ordinary skill in the art will recognize a variety of standard minimum processing approaches and circuits that may be used in relation to different embodiments of the present invention. Standard minimum processing circuit 431 provides a Min1 standard output 423 and a Min2 standard output 425 to one input of a multiplexer circuit 455. Predefined value pairs (i.e., A1 411 and B1 413, A2 415 and B2 417, and A3 419 and B3 421) are provided to other inputs of multiplexer circuit 455.

A row weight determination circuit 433 determines whether data received as modified output 412 is associated with a row of low weight. In some cases where, for example, modified output 412 corresponds to encoded data set 285, a row of low weight is determined by whether it is included in the rows of low weight codeword portion 291. In such a case, row weight determination circuit 433 includes a counter that maintains a count indicative of where the currently received data is from within encoded data set 285. Similarly, a row of high weight is determined by whether it is included in high weight codeword portion 292.

A low weight row indicator 451 is provided to a threshold determination circuit 435. Threshold determination circuit receives two threshold values (T1 and T2) that each correspond to different numbers of violated check equations identified when processing the row corresponding to modified output 412. Threshold determination circuit 435 asserts selector outputs (i.e., a selector output 437 and a selector output 439) that are provided to the selector inputs of multiplexer circuit 455 in accordance with the following pseudocode:

```
If (Low Weight Row Indicator 451 is Asserted)
{
    Selector Output 437 = 0;
    Selector Output 439 = 0
}
Else If (NVC < T1)
{
    Selector Output 437 = 1;
    Selector Output 439 = 0
}
Else If (NVC >= Ti and NVC< T2)
{
    Selector Output 437 = 0;
    Selector Output 439 = 1
I
Else
{
    Selector Output 437 = 1;
    Selector Output 439 = 1
}
```

Again, NVC denotes the number of number of violated checks detected by the decoder for the given row. Based upon the assertion of selector output 437 and selector output 439, the selected corresponding pairs (i.e., Min1 Standard 423 and Min2 Standard 425, A1 411 and B1 413, A2 415 and B2 417, or A3 419 and B3 421) are provided as Min1 424 and Min2 426, respectively.

Figure 4C:
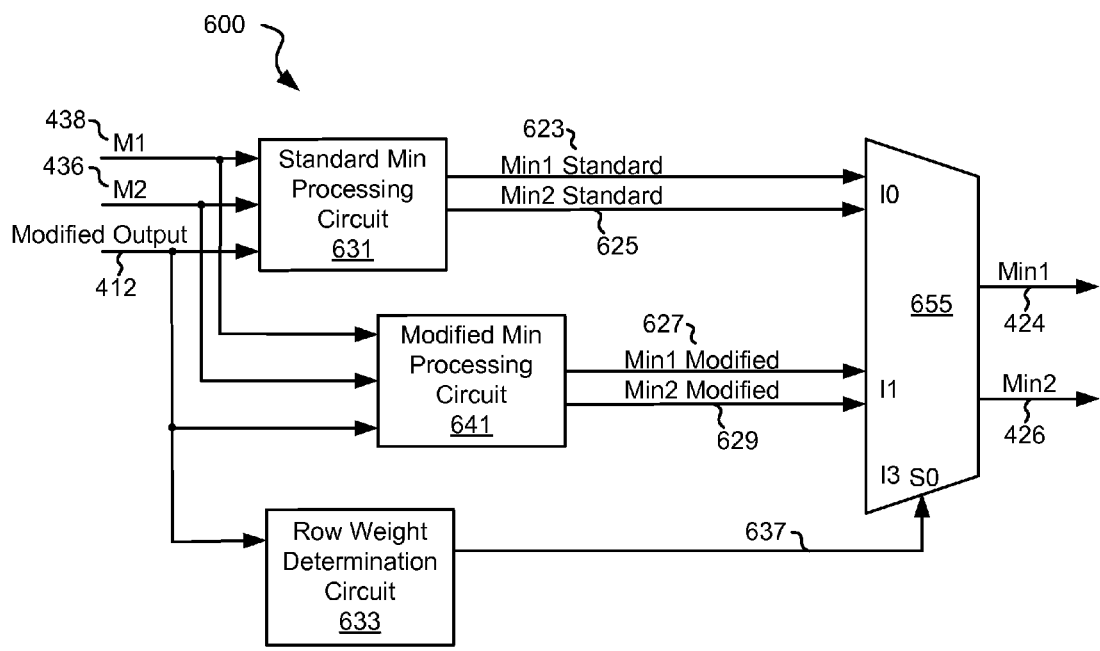
FIG. 4c shows another minimum determination circuit that may be used in relation to the multi-tier decoder circuit of FIG. 4a in accordance with particular embodiments of the present invention.

Turning to FIG. 4c, another minimum determination circuit 600 that may be used in relation to multi-tier decoder circuit 600 is shown in accordance with particular embodiments of the present invention. Minimum determination circuit 600 includes a standard minimum processing circuit 631 that receives modified output 412, M1 438 and M2 436. Using these inputs, standard minimum processing circuit 631 identifies minimums similar to that done in relation to standard LDPC processing. One example of such processing is disclosed in U.S. patent application Ser. No. 12/492,374 entitled "Reconfigurable Cyclic Shifter" that was previously incorporated herein by reference for all purposes. Based upon the disclosure provided herein, one of ordinary skill in the art will recognize a variety of standard minimum processing approaches and circuits that may be used in relation to different embodiments of the present invention. Standard minimum processing circuit 631 provides a Min1 standard output 623 and a Min2 standard output 625 to one input of a multiplexer circuit 655.

In addition, a modified min processing circuit 641 is included. Modified min processing circuit 641 applies the same standard minimum determination algorithm to the circulant portion of a row received a modified output 412. Using encoded data set 285 as an example, the bits of circulant 286 are modified such that high weight row portion 293 are changed such that circulant 286 is of low weight (i.e., '0100'), and circulant 286 is processed using the standard approach. The generated Min1 and Min2 values are used for all values in the circulant. Of note, the sign value generated by sign calculation circuit 470 is calculated based upon the unmodified bits of circulant 286. The same process is used when determining Min1 and Min2 values for circulant 287 and for circulant 288. These forced Min1 and Min2 values are provided as a Min1 modified value 627 and a Min2 modified value 629 to a second input of multiplexer circuit 655.

A row weight determination circuit 633 determines whether data received as modified output 412 is associated with a row of low weight. In some cases where, for example, modified output 412 corresponds to encoded data set 285, a row of low weight is determined by whether it is included in the rows of low weight codeword portion 291. In such a case, row weight determination circuit 633 includes a counter that maintains a count indicative of where the currently received data is from within encoded data set 285. Similarly, a row of high weight is determined by whether it is included in high weight codeword portion 292. Row weight determination circuit 633 provides a selector output 637 as the selector input of multiplexer circuit 655.

Figure 5:
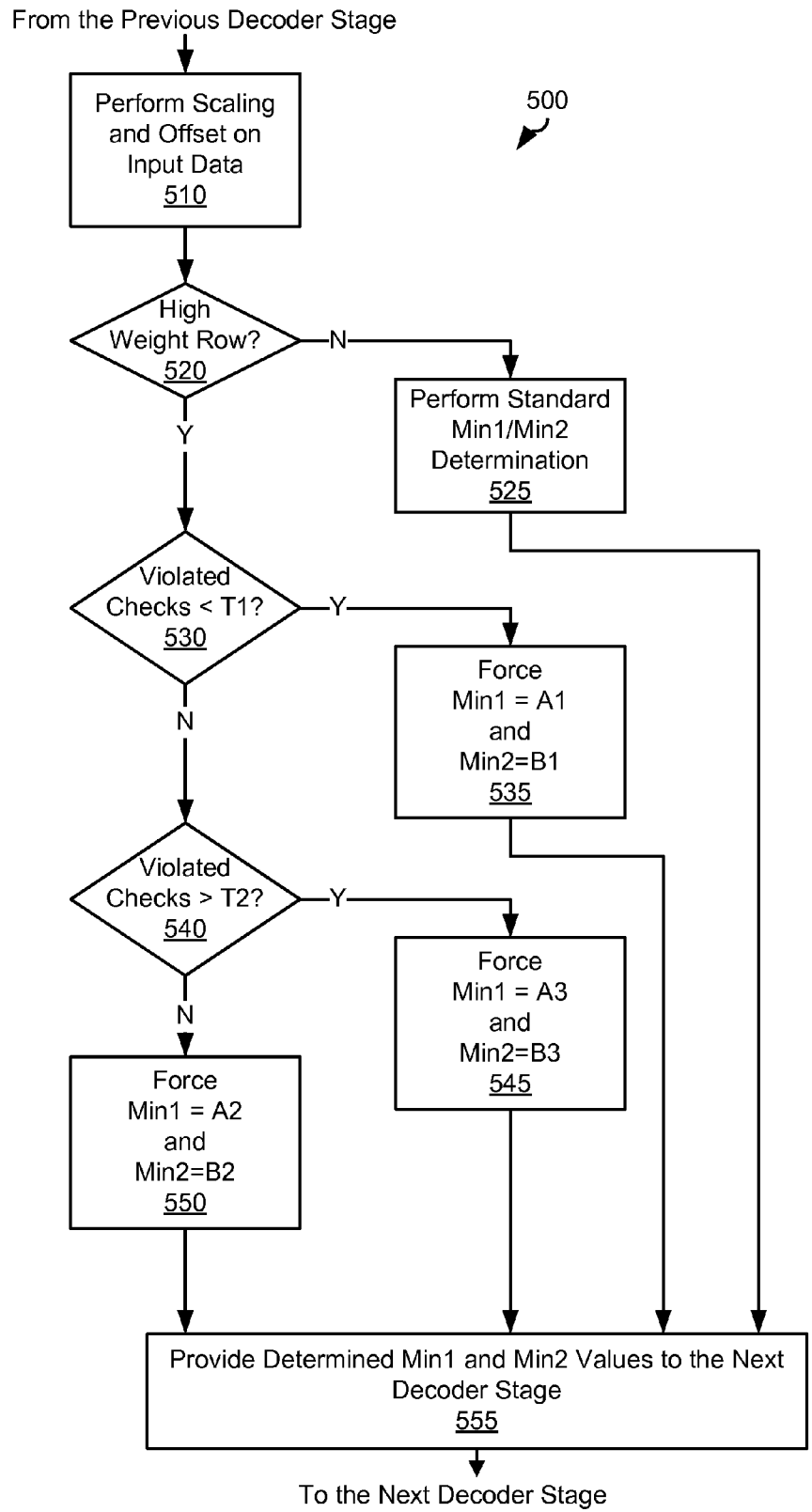
FIG. 5 is a flow diagram depicting one method for multi-tier decoding in accordance with some embodiments of the present invention.

Turning to FIG. 5, a flow diagram 500 depicts one method for multi-tier decoding in accordance with some embodiments of the present invention. Following flow diagram 500, data received from a previous decoder stage is scaled and/or offset to prepare the data for minimums determination (block 510). It is determined whether the data is associated with a row of high weight (block 520). This may be done, for example, by determining from which portion of an encoded data set the received data is derived. As a particular example, encoded data set 285 may be used in which case it is determined whether the received data is part of high weight codeword portion 292. This determination may be made, for example, by using a counter that monitors bit location with a given encoded data set. Where it is determined that the received data is not associated with a row of high weight (block 520), standard minimums processing is applied to the received data to determine Min1 and Min2 values for the received data (block 525). The determined values of Min1 and Min2 are then provided to the next stage of the decoder (block 555).

Alternatively, where the received data is associated with a row of high weight (block 520), it is determined whether the number of failed parity error check equations associated with the row is less than a predefined number (T1) (block 530). Where the number of failed parity error check equations is less than the threshold T1 (block 530), the value of Min1 is forced to be equal to a predefined value (A1) and the value of Min2 is forced to be equal to a predefined value (B1) (block 535). These determined values of Min1 and Min2 are then provided to the next stage of the decoder (block 555). Where, on the other hand, it is determined that the number of failed parity error check equations is greater than or equal to the threshold T1 (block 530), it is determined whether the number of failed parity error check equations associated with the row is greater than another predefined number (T2) (block 540). Where the number of failed parity error check equations is greater than the threshold T2 (block 540), the value of Min1 is forced to be equal to a predefined value (A3) and the value of Min2 is forced to be equal to a predefined value (B3) (block 545). These determined values of Min1 and Min2 are then provided to the next stage of the decoder (block 555). Alternatively, where the number of failed parity error check equations is less than or equal to the threshold T2 (block 540), the value of Min1 is forced to be equal to a predefined value (A2)

and the value of Min2 is forced to be equal to a predefined value (B2) (block 550), and these determined values of Min1 and Min2 are provided to the next stage of the decoder (block 555).

Figure 6:
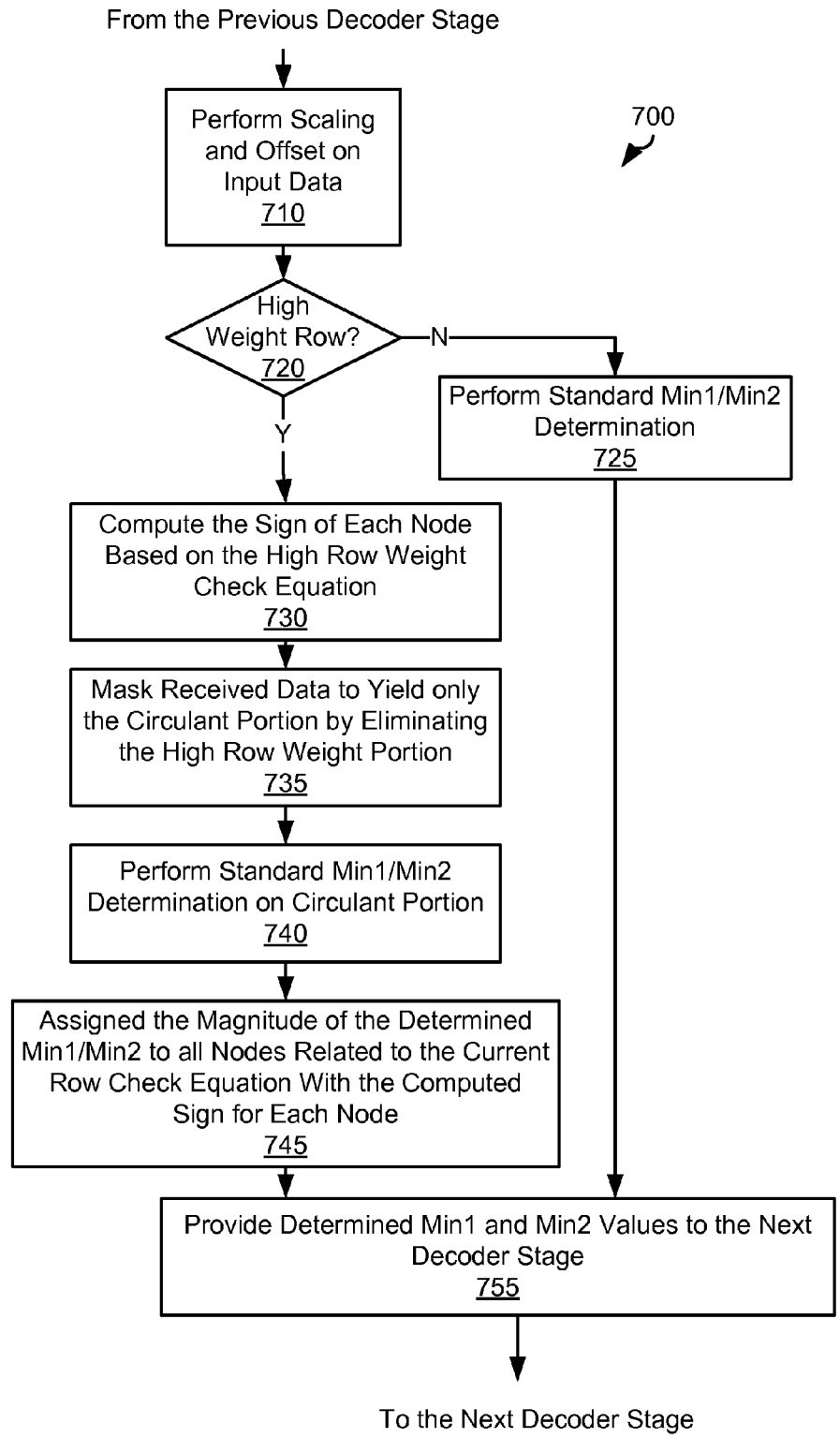
FIG. 6 is a flow diagram depicting another method for multi-tier decoding in accordance with other embodiments of the present invention.

Turning to FIG. 6, a flow diagram 700 depicts another method for multi-tier decoding in accordance with other embodiments of the present invention. Following flow diagram 700, data received from a previous decoder stage is scaled and/or offset to prepare the data for minimums determination (block 710). It is determined whether the data is associated with a row of high weight (block 720). This may be done, for example, by determining from which portion of an encoded data set the received data is derived. As a particular example, encoded data set 285 may be used in which case it is determined whether the received data is part of high weight codeword portion 292. This determination may be made, for example, by using a counter that monitors bit location with a given encoded data set. Where it is determined that the received data is not associated with a row of high weight (block 720), standard minimums processing is applied to the received data to determine Min1 and Min2 values for the received data (block 725). The determined values of Min1 and Min2 are then provided to the next stage of the decoder (block 755).

Alternatively, where the received data is associated with a row of high weight (block 720), a sign for each node in the received data is computed using a standard process for calculating the sign (block 730). In this case, the standard sign computation utilizes the data as received to calculate the sign. The received data is then masked to eliminate the '1s' that result in the high row weight and leave only the '1s' that correspond to a low row weight circulant (block 735). Using encoded data set 285 as an example, such masking would result in replacing the '1 1 1 1' pattern of high weight row portion 293 with a '0 1 0 0' pattern leaving circulant 286 of low row weight. Similarly, such masking would result in replacing the '1 1 1 1' pattern of high weight row portion 294 with a '0 1 0 0' pattern leaving circulant 287 of low row weight, and replacing the '1 1 1 1' pattern of high weight row portion 295 with a '0 1 0 0' pattern leaving circulant 288 of low row weight. These masked circulants are then processed using the standard standard minimums processing that was used in block 725 to determine Min1 and Min2 values for the received data (block 740). The magnitude of the determined Min1 and Min2 values are used for all nodes (including the masked nodes) of the circulant, and the previously calculated sign values from block 730 are applied to each individual node (block 745) to yield the final Min1 and Min2 values. These signed Min1 and Min2 are then provided to the next stage of the decoder (block 755).

In conclusion, the invention provides novel systems, devices, methods, formats and arrangements for data decoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing circuit, the data processing circuit comprising:
    a multi-tier decoding circuit having a first tier decoding circuit operable to decode portions of an encoded data set exhibiting low row weight to yield a first output, and a second tier decoding circuit operable to decode portions of an encoded data set exhibiting high row weight to yield a second output; and a selector circuit that selects between the first output and the second output to be provided as the low density parity check minimum values for the multi-tier decoding circuit, wherein the first output is selected when the encoded data set exhibiting low row weight, and wherein the second output is selected when the encoded data set exhibits high row weight.

2. The data processing circuit of claim 1, wherein the multi-tier decoding circuit includes a row weight determination circuit operable to receive a portion of the encoded data set and to provide an indication of whether the received portion exhibits a high weight or a low weight.

3. The data processing circuit of claim 2, wherein the encoded data set includes a high weight row portion and a low weight row portion, and wherein the row weight determination circuit includes a counter that counts received bits and utilizes the count value to indicate whether the received bits are associated with the high weight row portion or the low weight row portion.

4. The data processing circuit of claim 1, wherein the first tier decoding circuit applies a minimum processing algorithm to yield the first output, wherein the second tier decoding provides default values as the second output, and wherein one of the first output or the second output is provided as low density parity check minimum values for the multi-tier decoding circuit.

5. The data processing circuit of claim 4, wherein the multi-tier decoding circuit includes a comparator circuit operable to compare a number of violated checks for the currently processing portion of the encoded data set with a first predefined threshold value and a second predefined threshold.

6. The data processing circuit of claim 5, wherein the default values are selected from one of a first set of default values, a second set of default values or a third set of default values; wherein the second output includes the first set of default values when the number of violated checks for the currently processing portion of the encoded data set is less than a first predefined threshold level; wherein the second output includes the second set of default values when the number of violated checks for the currently processing portion of the encoded data set is greater than or equal to the first predefined threshold level and less than a second predefined threshold value; and wherein the second output includes the third set of default values when the number of violated checks for the currently processing portion of the encoded data set is greater than or equal to the second predefined threshold value.

7. The data processing circuit of claim 1, wherein the first tier decoding circuit is operable to apply a minimum processing algorithm to yield the first output, and wherein the second tier decoding is operable to apply the minimum processing algorithm to a modified version of the encoded data set to yield the second output.

8. The data processing circuit of claim 7, wherein the multi-tier decoding circuit includes a masking circuit operable to mask '1s' in the encoded data set to yield an encoded data set exhibiting only rows of low weight that are provided as the modified version of the encoded data set.

9. The data processing circuit of claim 8, wherein the multi-tier decoding circuit includes a sign calculation circuit operable to calculate a sign of the currently processing portion of the encoded data set unmodified by the masking circuit.

10. The data processing circuit of claim 9, wherein the second output is a combination of the sign with the result of the minimum processing of the modified version of the encoded data set.

11. The data processing circuit of claim 1, wherein the circuit is implemented as part of a device selected from a group consisting of: a storage device, and a data transmission device.

12. A method for low density parity check decoding, the method comprising:

receiving an encoded data set having a first portion with rows exhibiting low weight and a second portion with rows exhibiting high weight;

determining whether a sub-set of the encoded data set is included in the first portion or the second portion;

determining a pair of low density parity check minimum values for the sub-set of the encoded data set based at least in part on whether the sub-set is included in the first portion or the second portion, wherein determining the pair of low density parity check minimum values for the sub-set of the encoded data set includes:

applying a minimum processing algorithm to the sub-set of the encoded data set to yield a first output where the sub-set of the encoded data set is included in the first portion; and applying the minimum processing algorithm to a modified version of the encoded data set to yield a second output where the sub-set of the encoded data set is included in the second portion, wherein the modified version of the encoded data set is modified to eliminate at least one '1' from the encoded data set such that the modified version of the encoded data set exhibits only rows of low weight.

13. The method of claim 12, wherein the method further comprises:

calculating a sign of the sub-set of the encoded data set; and combining the sign with the second output to yield the pair of low density parity check minimum values when the sub-set of the encoded data set is included in the second portion.

14. A data manipulation system, the system comprising:

a data receiving circuit, wherein the data receiving circuit includes a multi-tier decoding circuit having a first tier decoding circuit operable to decode portions of an encoded data set exhibiting low row weight to yield a first output, and a second tier decoding circuit operable to decode portions of an encoded data set exhibiting high row weight to yield a second output; and a selector circuit that selects between the first output and the second output to be provided as the low density parity check minimum values for the multi-tier decoding circuit, wherein the first output is selected when the encoded data set exhibiting low row weight, and wherein the second output is selected when the encoded data set exhibits high row weight.

15. The data manipulation system of claim 14, wherein the data manipulation circuit further includes:

a data transfer circuit, wherein the data transfer circuit includes a multi-stage encoder circuit operable to generate the encoded data set from an original data set.

16. The data manipulation system of claim 14, wherein the data manipulation system is selected from a group consisting of a storage device and a data transmission device.

17. The data manipulation system of claim 14, wherein the system is implemented in an integrated circuit.

18. A method for low density parity check decoding, the method comprising:

receiving an encoded data set having a first portion with rows exhibiting low weight and a second portion with rows exhibiting high weight;

determining whether a sub-set of the encoded data set is included in the first portion or the second portion;

determining a pair of low density parity check minimum values for the sub-set of the encoded data set based at least in part on whether the sub-set is included in the first portion or the second portion, wherein determining the pair of low density parity check minimum values for the sub-set of the encoded data set includes:

applying a minimum processing algorithm to the sub-set of the encoded data set to yield a minimums output;

selecting a pair of default values where the sub-set of the encoded data set is included in the first portion;

providing the minimums output as the pair of low density parity check minimum values for the multi-tier decoding circuit when the sub-set of the encoded data set is included in the first portion; and providing the pair of default values as the pair of low density parity check minimum values for the multi-tier decoding circuit when the sub-set of the encoded data set is included in the second portion.

19. The method of claim 18, wherein the pair of default values is selected from a group consisting of a first set of default values, a second set of default values, and a third set of default values; and wherein selecting the pair of default values includes:

comparing a number of violated checks for the currently processing portion of the encoded data set with a first predefined threshold value and a second predefined threshold.

20. The method of claim 18, wherein selecting the pair of default values further includes:

providing the first set of default values as the pair of low density parity check minimum values when the number of violated checks for the currently processing portion of the encoded data set is less than a first predefined threshold level;

providing the second set of default values as the pair of low density parity check minimum values when the number of violated checks for the currently processing portion of the encoded data set is greater than or equal to the first predefined threshold level and less than a second predefined threshold value; and providing the third set of default values as the pair of low density parity check minimum values when the number of violated checks for the currently processing portion of the encoded data set is greater than or equal to the second predefined threshold level.

* * * * *